United States Patent
Chen et al.

(10) Patent No.: US 10,002,790 B2
(45) Date of Patent: *Jun. 19, 2018

(54) MECHANISMS FOR FORMING SEMICONDUCTOR DEVICE STRUCTURE WITH FEATURE OPENING

(71) Applicant: Taiwan Semiconductor Manufacturing Co., Ltd, Hsin-Chu (TW)

(72) Inventors: Yungtzu Chen, Hsin-Chu (TW); Yu-Shu Chen, Hsin-Chu (TW); Yu-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/243,663

(22) Filed: Aug. 22, 2016

(65) Prior Publication Data

US 2016/0358819 A1 Dec. 8, 2016

Related U.S. Application Data

(63) Continuation of application No. 14/583,238, filed on Dec. 26, 2014, now Pat. No. 9,425,094.

(51) Int. Cl.
*H01L 21/768* (2006.01)
*H01L 21/311* (2006.01)
(Continued)

(52) U.S. Cl.
CPC .. *H01L 21/76879* (2013.01); *H01L 21/02126* (2013.01); *H01L 21/02186* (2013.01); *H01L 21/31116* (2013.01); *H01L 21/31144* (2013.01); *H01L 21/32136* (2013.01); *H01L 21/76802* (2013.01); *H01L 21/76807* (2013.01); *H01L 21/76811* (2013.01); *H01L 2221/1063* (2013.01)

(58) Field of Classification Search
CPC ........... H01L 21/2063; H01L 21/31116; H01L 21/31138
USPC ................................ 438/710, 706, 714, 666
See application file for complete search history.

(56) References Cited

U.S. PATENT DOCUMENTS 6,410,426 B1   6/2002  Xing et al.
2004/0127016 A1*  7/2004  Hoog ................ H01L 21/76801
                                                               438/637

(Continued)

FOREIGN PATENT DOCUMENTS

CN   103426749 A   12/2013
CN   103531531 A   1/2014

*Primary Examiner* — Cuong Q Nguyen
*Assistant Examiner* — Tong-Ho Kim
(74) *Attorney, Agent, or Firm* — Slater Matsil, LLP

(57) ABSTRACT

A method for forming a semiconductor device structure is provided. The method includes forming a material layer over a semiconductor substrate and forming a hard mask layer over the material layer. The hard mask layer contains metal. The method also includes forming an opening in the hard mask layer using a plasma etching process, and a gas mixture used in the plasma etching process includes a nitrogen-containing gas, a halogen-containing gas, and a carbon-containing gas. The method further includes etching the material layer through the opening in the hard mask layer to form a feature opening in the material layer.

19 Claims, 11 Drawing Sheets

(51) Int. Cl.
*H01L 21/02* (2006.01)
*H01L 21/3213* (2006.01)

(56) References Cited

U.S. PATENT DOCUMENTS

| | | | |
|---|---|---|---|
| 2005/0079703 A1* | 4/2005 | Chen | C23F 3/04 |
| | | | 438/633 |
| 2006/0134921 A1* | 6/2006 | Wu | H01L 21/31116 |
| | | | 438/710 |
| 2007/0093069 A1 | 4/2007 | Tsai et al. | |
| 2008/0305639 A1 | 12/2008 | Kuo | |
| 2011/0108994 A1 | 5/2011 | Liang et al. | |
| 2012/0064713 A1* | 3/2012 | Russell | H01L 21/02277 |
| | | | 438/653 |
| 2012/0244458 A1* | 9/2012 | Luong | H01L 21/0337 |
| | | | 430/5 |
| 2013/0230983 A1 | 9/2013 | Yang et al. | |

\* cited by examiner

MECHANISMS FOR FORMING SEMICONDUCTOR DEVICE STRUCTURE WITH FEATURE OPENING

CROSS REFERENCE

This application is a Continuation application of U.S. patent application Ser. No. 14/583,238, filed on Dec. 26, 2014, the entire of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, these advances have increased the complexity of processing and manufacturing ICs.

Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
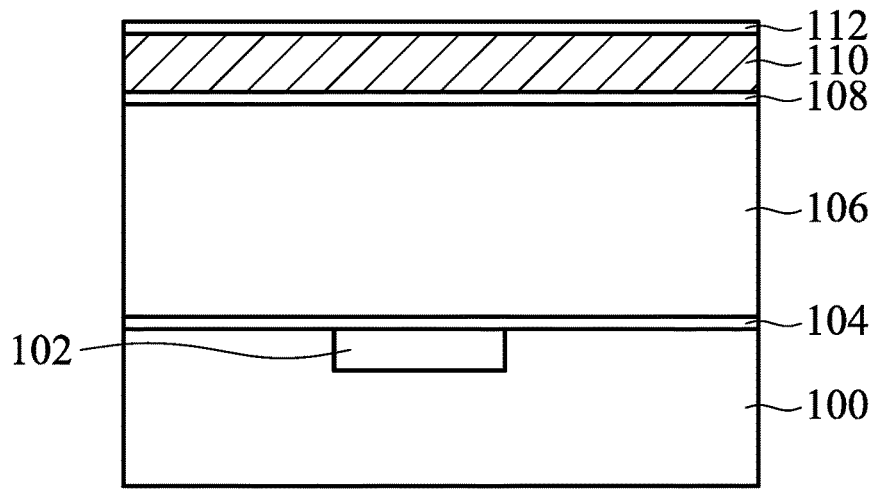
FIGS. 1A-1G are schematic cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 4:
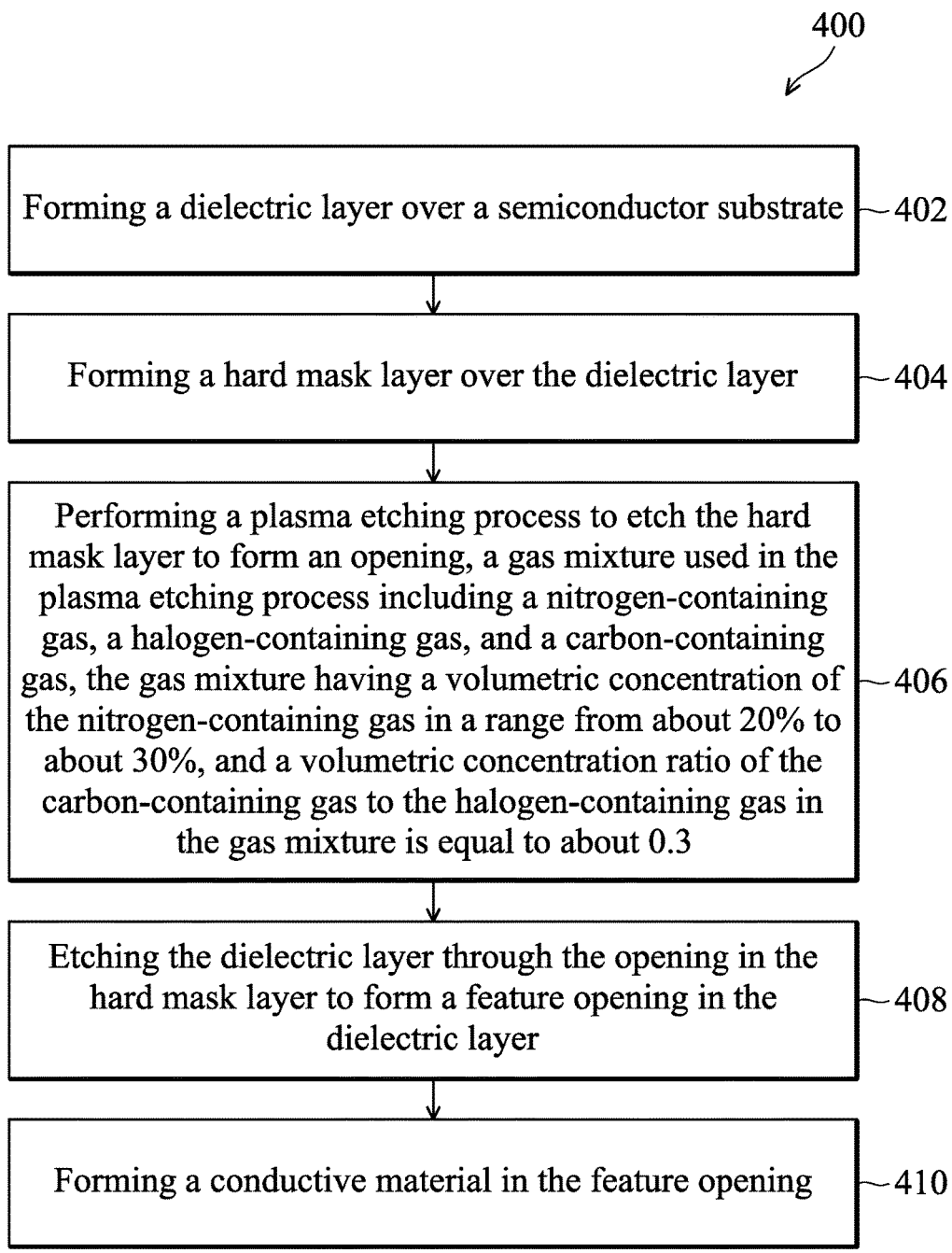
FIG. 4 is a flow chart illustrating a method for forming a semiconductor device structure, in accordance with some embodiments.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G, in accordance with some embodiments. FIG. 4 is a flow chart illustrating a method 400 for forming a semiconductor device structure, in accordance with some embodiments. For illustration, the flow chart will be described in company with the cross-sectional views shown in FIGS. 1A-1G. Some of the stages described can be replaced or eliminated for different embodiments. Additional features can be added in the semiconductor device structure. Some of the features described below can be replaced or eliminated for different embodiments.

Referring to FIGS. 1A and 4, the method 400 begins with an operation 402 in which a dielectric layer 106 is formed over a semiconductor substrate 100, in accordance with some embodiments. As shown in FIG. 1A, the semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features. In some embodiments, each of the isolation features has a multi-layer structure. In some embodiments, the isolation features are made of one or more dielectric materials. The dielectric materials may include silicon oxide, silicon nitride, silicon oxynitride, fluoride-doped silicate glass (FSG), low-K dielectric material, other suitable materials, or a combination thereof. In some embodiments, an STI liner (not shown) is formed to reduce crystalline defects at the interface between the semiconductor substrate 100 and the isolation features.

Examples of the various device elements, that may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

An exemplary conductive feature 102 is shown in FIG. 1A for illustration. In some embodiments, the conductive feature 102 is a source/drain feature. The source/drain feature may include a doped region or a raised epitaxially grown feature. In some embodiments, the conductive feature 102 is a gate electrode. Alternatively, the conductive feature 102 may be a metal silicide feature formed on the source/drain feature or the gate electrode. In some embodiments, the metal silicide feature is formed using a self-aligned silicide (salicide) technique.

In some other embodiments, the conductive feature 102 includes an electrode of a capacitor or one end of a resistor. In some embodiments, the semiconductor substrate 100 includes a portion of an interconnect structure. The conductive feature 102 may include a conductive contact, a conductive line, a conductive via, another suitable conductive element, or a combination thereof.

As shown in FIG. 1A, an etch stop layer 104 is deposited over the semiconductor substrate 100 and the conductive feature 102, in accordance with some embodiments. The etch stop layer 104 is used to protect the conductive feature 102 from being damaged during subsequent processes for forming contact holes, via holes, and/or trenches. In some embodiments, the etch stop layer 104 is made of silicon nitride (SiN), silicon oxynitride (SiON), silicon carbide (SiC), silicon carbo-nitride (SiCN), silicon oxycarbide (SiCO), another suitable material, or a combination thereof. In some embodiments, the etch stop layer 104 is deposited using a chemical vapor deposition (CVD) process, a spin-on process, another applicable process, or a combination thereof. Many variations and modifications can be made to embodiments of the disclosure. In some other embodiments, the etch stop layer 104 is not formed.

As shown in FIG. 1A, the dielectric layer 106 is deposited over the etch stop layer 104, in accordance with some embodiments. The dielectric layer 106 may serve as an inter-metal dielectric (IMD) layer or inter-layer dielectric (ILD) layer. In some embodiments, the dielectric layer 106 is made of a low-k dielectric material. The low-k dielectric material has a dielectric constant smaller than that of silicon dioxide. For example, the low-k dielectric material has a dielectric constant in a range from about 1.2 to about 3.5. As the density of a semiconductor device increases and the size of its circuit elements becomes smaller, the resistance capacitance (RC) delay time increasingly dominates circuit performance. Using a low-k dielectric material as the dielectric layer 106 is helpful in reducing the RC delay.

In some embodiments, the dielectric layer 106 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 106 includes a material including Si, C, O, or H. For example, the dielectric layer 106 includes $SiO_2$, SiOC, SiON, SiCOH, SiOCN, or a combination thereof. In some embodiments, the dielectric layer 106 includes fluorine-doped silicate glass (FSG) such as fluorine-doped —(O—$Si(CH_3)_2$—O)—. In some embodiments, the dielectric layer 106 is deposited using a CVD process, an atomic layer deposition (ALD) process, a spin-on process, a spray coating process, another applicable process, or a combination thereof.

Referring to FIGS. 1A and 4, the method 400 continues with an operation 404 in which a hard mask layer 110 is formed over the dielectric layer 106, in accordance with some embodiments. As shown in FIG. 1A, before forming the hard mask layer 110, an anti-reflection layer 108 is deposited over the dielectric layer 106, in accordance with some embodiments. In some embodiments, the anti-reflection layer 108 can be used to assist in subsequent patterning operations. In some embodiments, the anti-reflection layer 108 is made of silicon oxide, silicon carbide, silicon carbon oxide, silicon oxynitride, silicon nitride, silicon oxycarbide, chromium, chromium oxide, chromium nitride, chromium oxynitride, titanium, another suitable material, or a combination thereof. In some other embodiments, the anti-reflection layer 108 is substantially nitrogen free. In some embodiments, the anti-reflection layer 108 is deposited using a CVD process, a spin-on process, a physical vapor deposition (PVD) process, another applicable process, or a combination thereof.

However, it should be appreciated that many variations and modifications can be made to embodiments of the disclosure. In some embodiments, the anti-reflection layer 108 is not formed.

As shown in FIG. 1A, the hard mask layer 110 is deposited over the anti-reflective layer 108 (and/or the dielectric layer 106), in accordance with some embodiments. The hard mask layer 110 is used to assist in subsequent patterning operations of the dielectric layer 106. In some embodiments, the hard mask layer 110 includes a metal material. In some embodiments, the hard mask layer 110 is made of titanium nitride, titanium, another suitable material, or a combination thereof. In some embodiments, the hard mask layer 110 is a single layer. In some other embodiments, the hard mask layer 110 has a multi-layered structure that includes multiple sub-layers. In some embodiments, the thickness of the hard mask layer 110 is in a range from about 200 Å to about 500 Å. In some embodiments, the hard mask layer 110 is deposited using a CVD process, a PVD process, an electroplating process, an electroless plating process, a spin-on process, another applicable process, or a combination thereof.

As shown in FIG. 1A, a mask layer 112 is deposited over the hard mask layer 112, in accordance with some embodiments. The mask layer 112 is used to assist in subsequent patterning operations of the hard mask layer 110. In some embodiments, the mask layer 112 is also used as an anti-reflection layer for a subsequent patterning process. In some embodiments, the mask layer 112 is made of a material the same as that of the anti-reflection layer 108. In some embodiments, the mask layer 112 is made of silicon carbon oxide, silicon oxide, silicon carbide, silicon oxynitride, silicon nitride, silicon oxycarbide, chromium, chromium oxide, chromium nitride, chromium oxynitride, titanium, another suitable material, or a combination thereof. In some other embodiments, the mask layer 112 is substantially nitrogen free. In some embodiments, the anti-reflection layer 108 is deposited using a CVD process, a spin-on process, a physical vapor deposition (PVD) process, another applicable process, or a combination thereof.

Figure 1B:
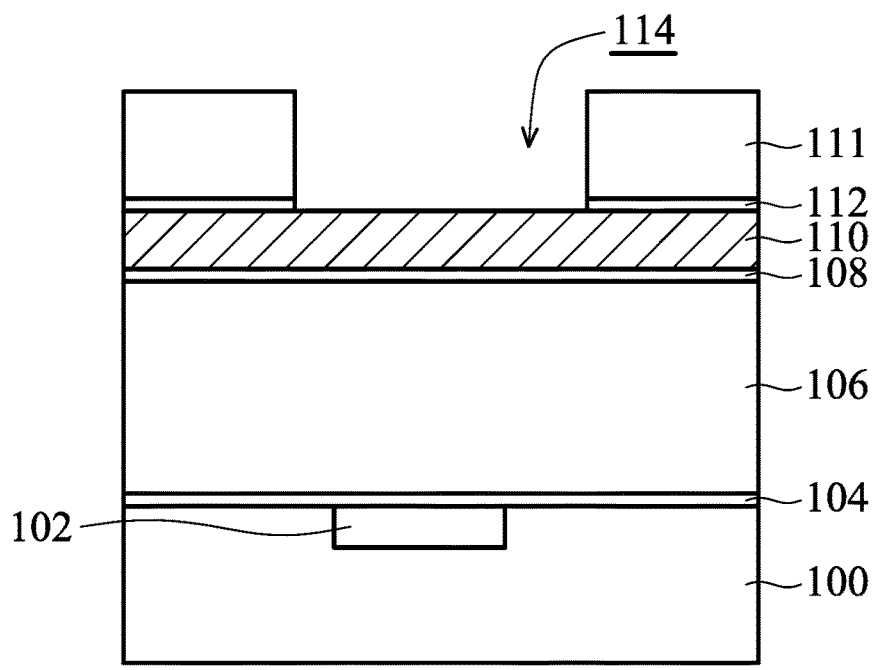
Figure 1C:
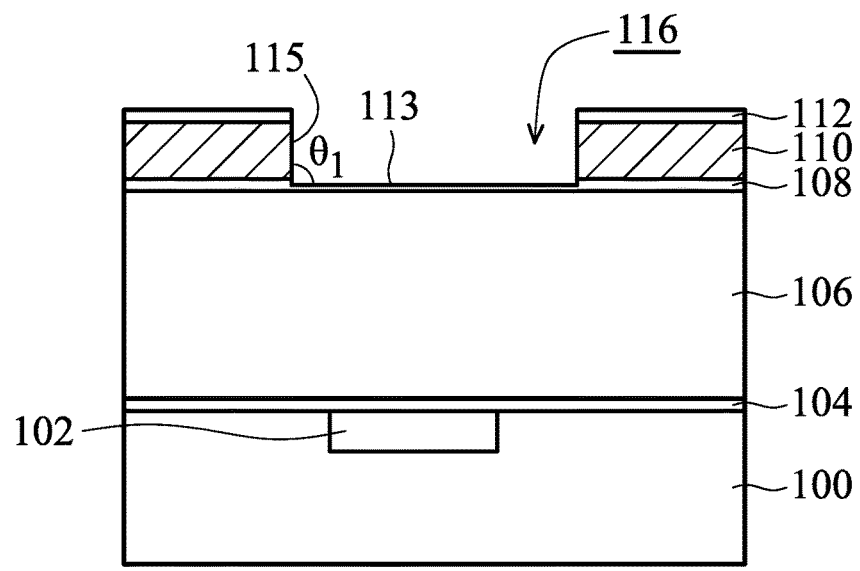

Referring to FIGS. 1B, 1C, and 4, the method 400 continues with an operation 406 in which the hard mask layer 110 is etched to form an opening 116 in the hard mask layer 110 by using a plasma etching process, in accordance with some embodiments. As shown in FIG. 1B, a patterned photoresist layer 111 is formed over the mask layer 112 for patterning the mask layer 112, in accordance with some embodiments. As mentioned above, the mask layer 112 may also be used as an anti-reflection layer. For example, the mask layer 112 is used to assist in the photolithography process for forming the patterned photoresist layer 111. The patterned photoresist layer 111 has an opening 114 which exposes the mask layer 112. Afterwards, an etching operation is performed to transfer the pattern of the patterned photoresist layer 111 to the mask layer 112. The opening 114 further extends through the mask layer 112 to expose the hard mask layer 110, as shown in FIG. 1B. Afterwards, the photoresist layer 111 is removed in some embodiments. The photoresist layer 111 may be removed by wet stripping or plasma ashing.

As shown in FIG. 1C, the hard mask layer 110 is partially removed using a plasma etching process to form the opening 116 in the hard mask layer 110, in accordance with some embodiments. In some embodiments, since the photoresist layer 111 is removed before the plasma etching process, the plasma etching process may be prevented from being negatively affected by the photoresist layer 111. In some embodiments, the opening 116 further extends into the anti-reflection layer 108, as shown in FIG. 1C. In some other embodiments, the opening 116 penetrates through the anti-reflection layer 108 and exposes the dielectric layer 106. The mask layer 112 may serve as an etching mask during the etching of the hard mask layer 110. Many variations and modifications can be made to embodiments of the disclosure. In some embodiments, the mask layer 112 is not formed. In these cases, the photoresist layer 111 may be used as an etching mask during the etching of the hard mask layer 110.

The condition of the plasma etching process is carefully controlled to ensure that the opening 116 has the desired profile. As shown in FIG. 1C, the opening 116 has a sidewall 115 and a bottom portion 113. An angle $\theta_1$ is between the sidewall 115 and the bottom portion 113 of the opening 116. In some embodiments, the sidewall 115 is a vertical sidewall. In some embodiments, the hard mask layer 110 having such profile of the opening 116 can facilitate a subsequent patterning operation of the dielectric layer 106. It should be appreciated that the term "vertical sidewall" does not mean that the sidewall 115 has to be perfectly vertical. In some embodiments, the sidewall 115 is more like a substantially vertical sidewall. In these cases, the angle $\theta_1$ is substantially equal to 90 degrees. In some embodiments, the angle $\theta_1$ is in a range from about 89 degrees to about 91 degrees. In some embodiments, the angle $\theta_1$ is in a range from 89 degrees to 90 degrees.

As mentioned above, the plasma etching process is performed to form the opening 116 in the hard mask layer 110. In some embodiments, for performing the plasma etching process, a gas mixture is introduced into a process chamber where the structure shown in FIG. 1C is positioned. In some embodiments, the process chamber is maintained under a pressure of about 5 mtorrs, and the gas mixture is excited to generate plasma. The plasma is directed to etch the exposed portion of the exposed hard mask layer 110. As a result, the opening 116 is formed. In some embodiments, the gas mixture used in the plasma etching process includes a nitrogen-containing gas, a halogen-containing gas, and a carbon-containing gas. The halogen-containing gas may be used to produce main etching plasma that serves as a main etchant for etching the hard mask layer 110. Both of the nitrogen-containing gas and the carbon-containing gas may be used to control the profile of the opening 116 during the plasma etching process. Due to the nitrogen-containing gas and the carbon-containing gas, a protection or passivation material may be formed to protect sidewalls of openings during the plasma etching process. In some cases, if the nitrogen-containing gas and the carbon-containing gas are not used, the opening 116 may have a slanted sidewall and an undercut profile, that may cause a subsequent conductive feature formation process to be difficult to perform.

To ensure that the opening 116 in the hard mask layer 110 has the substantially vertical sidewall 115, the composition of the gas mixture is carefully controlled, in accordance with some embodiments. In some embodiments, the gas mixture has a volumetric concentration of the nitrogen-containing gas that is controlled to be in a range from about 20% to about 30%. In some embodiments, the nitrogen-containing gas is nitrogen gas. In some embodiments, the halogen-containing gas includes chlorine gas, bromine gas, hydrogen chloride gas, another suitable gas, or a combination thereof. In some embodiments, the carbon-containing gas includes methane gas, another suitable gas, or a combination thereof. In some embodiments, the gas mixture includes nitrogen gas, chlorine gas, and methane gas. In some embodiments, the volumetric concentration of the chlorine gas in the gas mixture is higher than that of the methane gas. In some embodiments, a volumetric concentration ratio of the carbon-containing gas to the halogen-containing gas is controlled to be equal to about 0.3.

The volumetric concentrations of the gases in the gas mixture may be tuned by controlling the flow rates of the gases. In some embodiments, the flow rate of nitrogen gas is in a range from about 30 sccm to about 60 sccm. The flow rate of chlorine gas is in a range from about 85 sccm to about 115 sccm. The flow rate of methane gas is in a range from about 15 sccm to about 45 sccm. In some other embodiments, the flow rate of nitrogen gas is about 45 sccm, the flow rate of chlorine gas is about 100 sccm, and the flow rate of methane gas is about 30 sccm.

Studies show that the profile of the opening 116 formed in the hard mask layer 110 may be controlled by fine-tuning the volumetric concentration of the nitrogen-containing gas. While the hard mask layer 110 is being etched to form the opening 116, a protection material or a passivation material (not shown) may be formed over sidewalls of the hard mask layer 110. The protection material may be formed due to the reactions between the hard mask layer 110 and the gas mixture (and/or the plasma generated by exciting the gas mixture). The protection material may be a Ti—Cl—N—C containing material. The deposition rate of the protection material may partially depend on the amount of the nitrogen-containing gas in the gas mixture. The protection material may slow down the lateral etching rate during the plasma etching process. By tuning the volumetric concentration of the nitrogen-containing gas, the lateral etching rate is therefore controlled.

As mentioned above, the deposition rate of the protection material formed during the plasma etching process may be varied through tuning the amount of the nitrogen-containing gas in the gas mixture. The volumetric concentration of the nitrogen-containing gas in the gas mixture is controlled to be in a range from about 20% to about 30% in some embodiments. In some cases, if the volumetric concentration of the nitrogen-containing gas in the gas mixture is less than about 20%, the protection material formed accordingly may not be sufficient. As a result, the lateral etching rate during the etching process may still be too high. An opening, which has a slanted sidewall, may therefore be formed. Due to insufficient protection, the opening may also have an undercut profile that may cause a subsequent conductive feature formation process to be difficult to perform. In these cases, the angle between the sidewall of the opening and the bottom portion of the opening may be smaller than 89 degrees. For example, the angle may be smaller than about 85 degrees.

In some other cases, if the volumetric concentration of the nitrogen-containing gas is greater than about 30%, the protection material formed accordingly may be too much. The lateral etching rate during the etching process may be retarded too much. As a result, an opening, which has a slanted sidewall, may be formed. The angle between the sidewall of the opening and the bottom portion of the opening may be greater than 91 degrees. For example, the angle may be greater than about 95 degrees.

However, it should be appreciated that the volumetric concentration of the nitrogen-containing gas in the gas mixture is not limited to a range from about 20% to about 30%. The volumetric concentration of the nitrogen-containing gas may be in a different range in some other cases. For example, the volumetric concentration of the nitrogen-containing gas in the gas mixture is in a range from about 22% to about 28%. In some embodiments, the volumetric concentration of the nitrogen-containing gas in the gas mixture is about 25%.

As mentioned above, a volumetric concentration ratio of the carbon-containing gas to the halogen-containing gas in the gas mixture is further controlled to be equal to about 0.3, in accordance with some embodiments. In some cases, the carbon-containing gas or the plasma generated from the carbon-containing gas not only forms the protection material but also react with the mask layer 112. Therefore, in some embodiments, to ensure the opening of the mask layer 112 has a desired size, the volumetric concentration ratio of the carbon-containing gas to the halogen-containing gas in the gas mixture is maintained to be substantially constant such as about 0.3. By controlling the volumetric concentration ratio of the carbon-containing gas to the halogen-containing gas in the gas mixture to be equal to about 0.3, an appropriate etching speed and a suitable etching profile of the opening may be achieved.

In some cases, if the volumetric concentration ratio of the carbon-containing gas to the halogen-containing gas is not equal to about 0.3, the shape and profile of the opening of the mask layer 112 may be changed during the plasma etching process. The profile of the opening 116 in the hard mask layer 110 is also negatively affected accordingly.

Figure 1D:
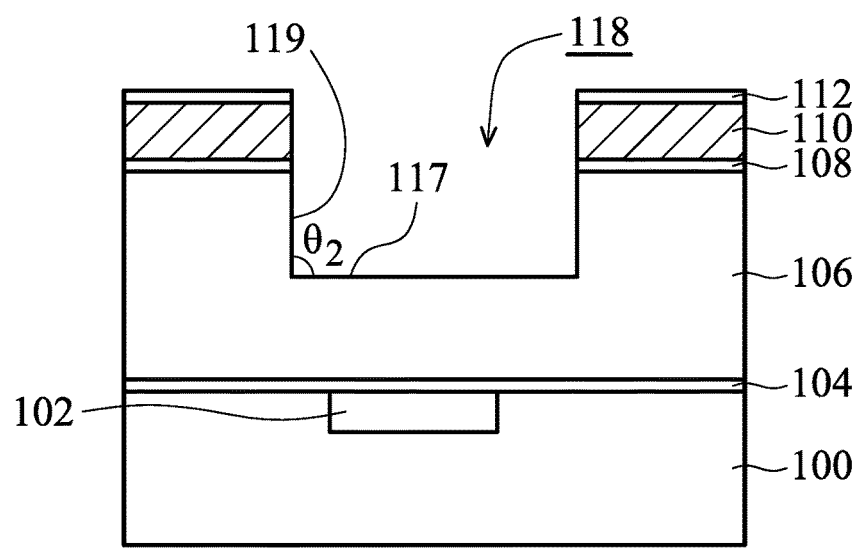

Referring to FIGS. 1D and 4, the method 400 continues with an operation 408 in which the dielectric layer 106 is etched through the opening 116 in the hard mask layer 110 to form a feature opening 118, in accordance with some embodiments. As shown in FIG. 1D, the hard mask layer 110 is used as an etching mask to assist in the formation of the feature opening 118, in accordance with some embodiments. The dielectric layer 106 is etched through the opening 116 in the hard mask layer 110. In some embodiments, the feature opening 118 is a trench opening, as shown in FIG. 1D. However, it should be appreciated that embodiments of the disclosure have many variations. In some other embodiments, the feature opening 118 is a via hole. In some other embodiments, the feature opening 118 is a contact hole.

Since the sidewall 115 of the opening 116 is substantially vertical, the portion of the hard mask layer 110 surrounding the opening 116 has a relatively uniform thickness when compared to a hard mask layer having an opening with slanted sidewalls. Therefore, the portion of the hard mask layer 110 surrounding the opening 116 has a sufficient and uniform thickness to protect the underlying dielectric layer 106 during subsequent etching operations.

As shown in FIG. 1D, the feature opening 118 has a sidewall 119 and a bottom portion 117. An angle $\theta_2$ is between the sidewall 119 and the bottom portion 117 of the feature opening 118. In some embodiments, because the dielectric layer 106 under the hard mask layer 110 is well protected during the etching process for forming the feature opening 118, the sidewall 119 is substantially coplanar with the sidewall 115 shown in FIG. 1C. The sidewall 119 is also a substantially vertical sidewall. The angle $\theta_2$ is substantially equal to 90 degrees. In some embodiments, the angle $\theta_2$ is in a range from about 89 degrees to about 91 degrees. In some other embodiments, the angle $\theta_2$ is in a range from 89 degrees to about 90 degrees. Because the profile of the opening 116 is controlled, the profile of the feature opening 118 is also well controlled to have vertical sidewalls. The profile uniformity including the depth uniformity of different feature openings formed using the methods mentioned above is also improved. Studies show that the openings in the dielectric layer 106 formed under the openings with vertical sidewalls can have sufficient and uniform depths.

Figure 1E:
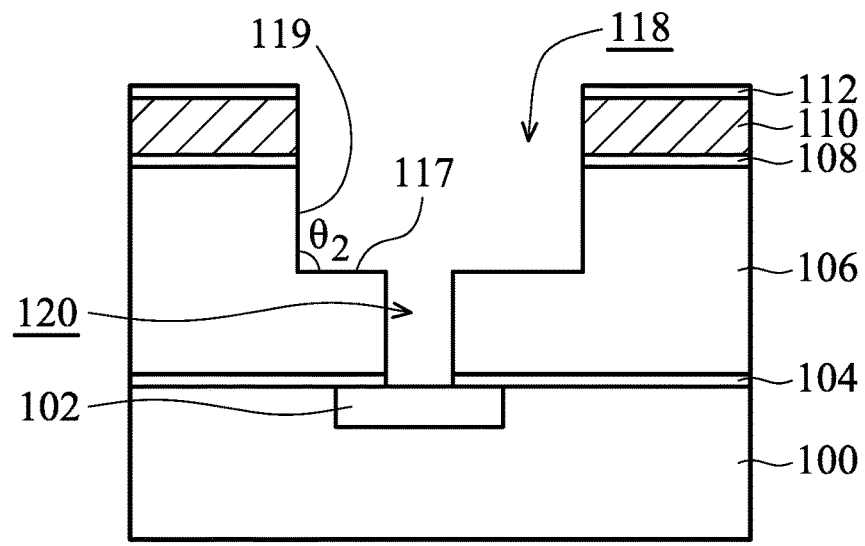

As shown in FIG. 1E, the dielectric layer 106 is partially removed to form a via hole 120 exposing the conductive feature 102, in accordance with some embodiments. A photolithography process and an etching process may be used to partially remove the dielectric layer 106 such that a portion of the etch stop layer 104 is exposed. Afterwards, another etching operation is performed to remove the exposed portion of the etch stop layer 104 to form the via hole 120. As shown in FIG. 1E, the via hole 120 exposes the conductive feature 102. Many variations and modifications can be made to embodiments of the disclosure. In some other embodiments, a hard mask layer similar to the hard mask layer 110 is used to assist in the formation of the via hole 120.

Figure 1F:
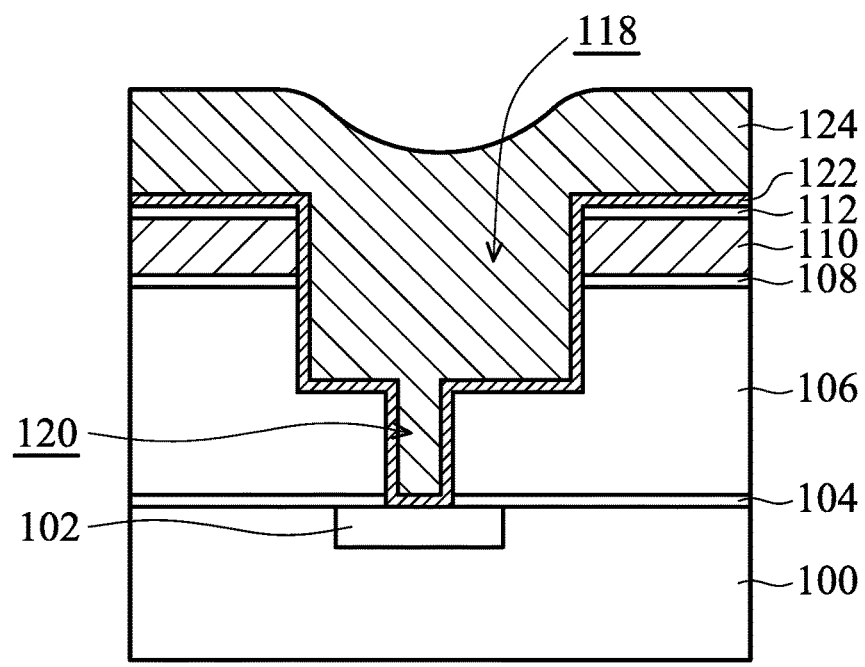

Referring to FIGS. 1F and 4, the method 400 continues with an operation 410 in which one or more conductive materials are formed in the feature opening 118, in accordance with some embodiments. As shown in FIG. 1F, a barrier layer 122 is deposited over the mask layer 122 and bottoms and sidewalls of the feature opening 118 and via hole 120, in accordance with some embodiments. Afterwards, one or more conductive material(s) 124 is(are) deposited over the barrier layer 122, as shown in FIG. 1F in accordance with some embodiments. The barrier layer 122 is used to protect the dielectric layer 106 from diffusion of a metal material from the conductive material 124. The barrier layer 122 may also serve as an adhesion layer between the conductive material 124 and the dielectric layer 106.

In some embodiments, the barrier layer 122 is made of titanium nitride, tantalum nitride, titanium, tungsten nitride, another suitable material, or a combination thereof. In some embodiments, the barrier layer 122 is deposited using a PVD process, a CVD process, an ALD process, an electroless plating process, another applicable process, or a combination thereof.

In some embodiments, the conductive material 124 is made of copper, aluminum, tungsten, titanium, nickel, gold, platinum, another suitable conductive material, or a combination thereof. In some embodiments, the conductive material 124 is deposited using an electrochemical plating process, an electroless plating process, a PVD process, a CVD process, a spin-on process, another applicable process, or a combination thereof.

In some embodiments, a seed layer (not shown) is deposited over the barrier layer 122 before the conductive material 124 is deposited, in accordance with some embodiments. In some embodiments, the seed layer is formed conformally over the barrier layer 122. The seed layer is used to assist in the formation of the conductive material 124.

In some embodiments, the seed layer is made of copper or copper alloy. In some embodiments, the seed layer includes copper, silver, gold, titanium, aluminum, tungsten, another suitable material, or a combination thereof. In some embodiments, the seed layer is deposited using a PVD process, a CVD process, another applicable process, or a combination thereof. Embodiments of the disclosure have many variations. In some other embodiments, the seed layer is not formed. In some other embodiments, the barrier layer 122 is not formed.

Figure 1G:
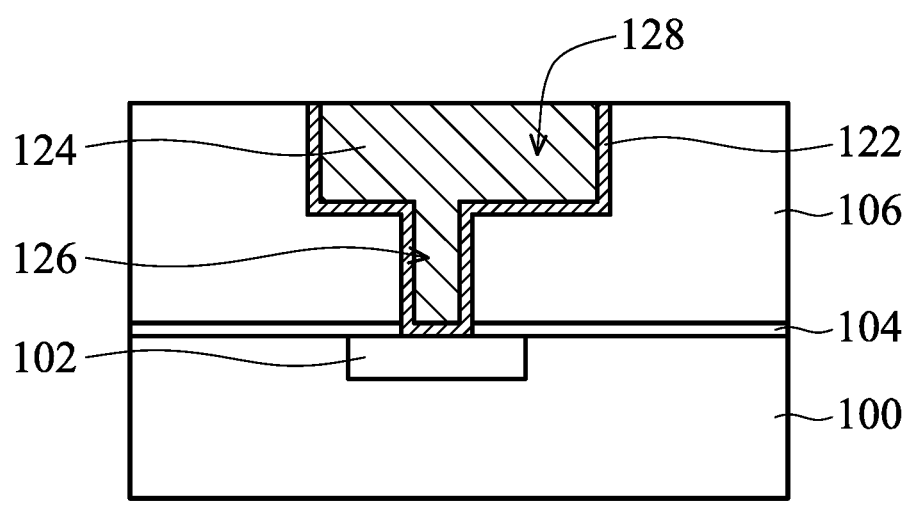

As shown in FIG. 1G, the portions of the conductive material 124 and the barrier layer 122 outside of the feature opening 118 are removed, in accordance with some embodiments. In some embodiments, a planarization process is performed on the conductive material 124. In some embodiments, the anti-reflection layer 108, the hard mask layer 110, and the mask layer 112 are also removed during the planarization process. The planarization process may include a chemical mechanical polishing (CMP) process, a grinding process, an etching process, another applicable process, or a combination thereof. As a result, a dual damascene structure including conductive features 126 and 128 are formed. In some embodiments, the conductive feature 126 serves as a conductive via, and the conductive feature 128 serves as a conductive line. With the assistance of the hard mask layer 110 having the vertical sidewall 115, the profile of the feature opening 118 is well controlled. Therefore, the electrical quality of the conductive feature 128 is improved.

Figure 2A:
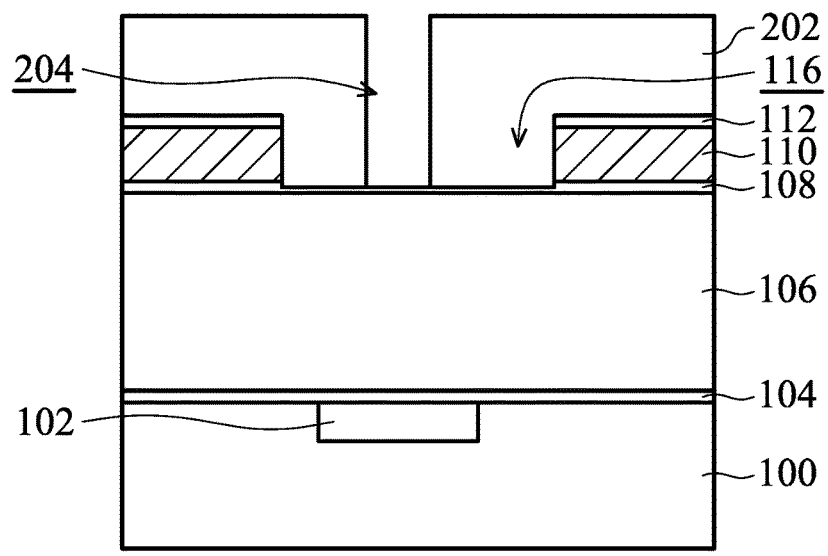
FIGS. 2A-2E are schematic cross-sectional views of various stages of a process for forming a semiconductor device structure, in accordance with some embodiments.

Many variations and modifications can be made to embodiments of the disclosure. For example, the formation sequence of a trench opening and a via hole may be varied. FIGS. 2A-2E are cross-sectional views of various stages of a process for forming a semiconductor device structure, in accordance with some embodiments. In some embodiments, the method 400 can also be applied in the embodiments illustrated in FIGS. 2A-2E. As shown in FIG. 2A, a structure similar to the structure shown in FIG. 1C is provided. The materials and formation methods of the structure are illustrated in the embodiments mentioned above and are not repeated.

As shown in FIG. 2A, a patterned mask layer 202 is formed over the structure similar to that shown in FIG. 1C, in accordance with some embodiments. The patterned mask layer 202 has an opening 204 which exposes the anti-reflection layer 108. In some embodiments, the patterned mask layer 202 is a patterned photoresist layer. In some other embodiments, the patterned mask layer 202 is a hard mask layer similar to the hard mask layer 110.

Figure 2B:
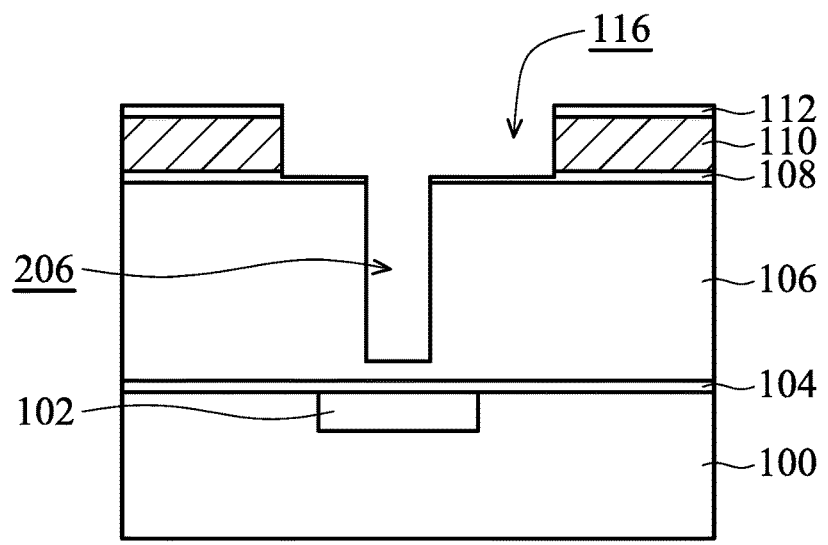

As shown in FIG. 2B, the dielectric layer 106 is etched through the opening 204 to form a hole 206 in the dielectric layer 106, in accordance with some embodiments. Afterwards, the mask layer 202 is removed. In some embodiments, the bottom of the hole 206 is separated from the etch stop layer 104 by a distance, as shown in FIG. 2B. In some other embodiments, the hole 206 exposes the etch stop layer 104.

Figure 2C:
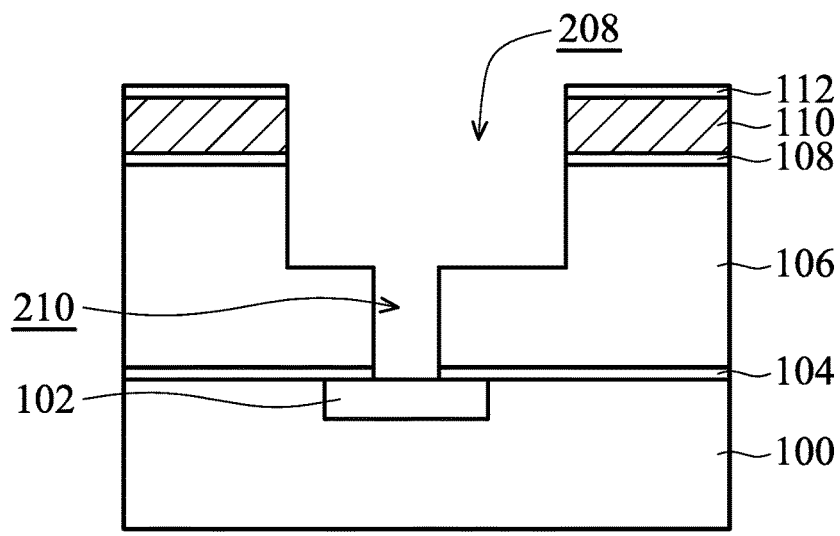

As shown in FIG. 2C, the dielectric layer 106 is etched through the opening 116 of the hard mask layer 110 to form a trench opening 208, in accordance with some embodiments. In some embodiments, the hole 206 further extends downwards to expose the etch stop layer 104. Afterwards, another etching operation is used to remove the exposed portion of the etch stop layer 104 such that the conductive feature 102 is exposed. As shown in FIG. 2C, a via hole 210, which exposes the conductive feature 102, is formed.

Figure 2D:
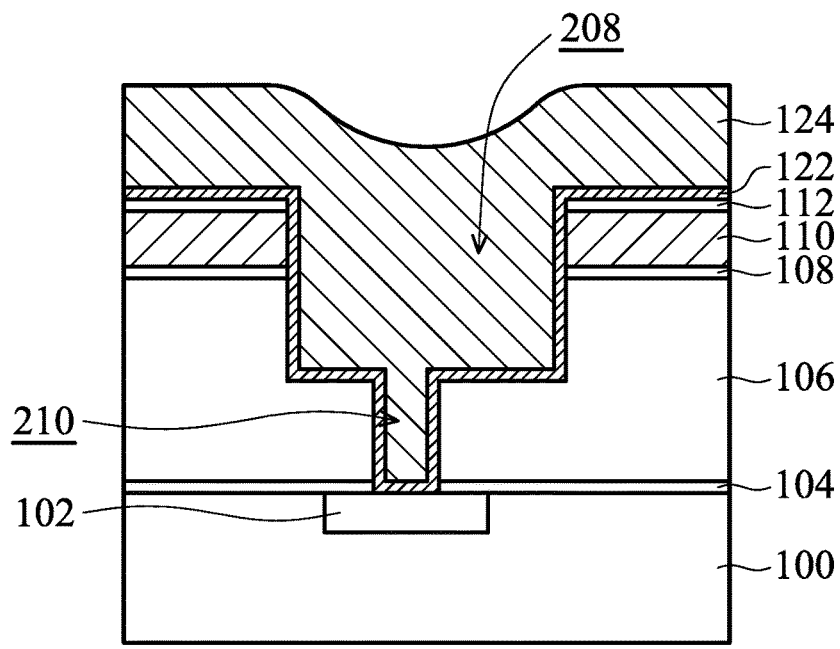

As shown in FIG. 2D, similar to the embodiments illustrated in FIG. 1F, the barrier layer 122 and the conductive material 124 are formed, in accordance with some embodiments. The barrier layer 122 and the conductive material 124 fill the trench opening 208 and the via hole 210.

Figure 2E:
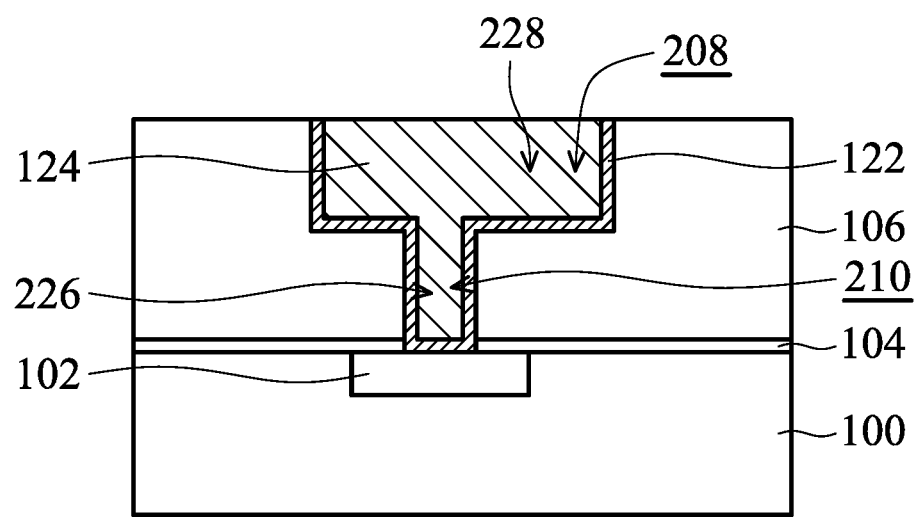

As shown in FIG. 2E, the portions of the conductive material 124 and the barrier layer 122 outside of the trench opening 208 are removed, in accordance with some embodiments. In some embodiments, a planarization process is performed on the conductive material 124. In some embodiments, the anti-reflection layer 108, the hard mask layer 110, and the mask layer 112 are also removed during the planarization process. The planarization process may include a chemical mechanical polishing (CMP) process, a grinding process, an etching process, another applicable process, or a combination thereof. As a result, a dual damascene structure including conductive features 226 and 228 are formed. In some embodiments, the conductive feature 226 serves as a conductive via, and the conductive feature 228 serves as a conductive line.

Many variations and modifications can be made to embodiments of the disclosure. For example, the semiconductor device structure is not limited to being formed using a dual damascene process. In some other embodiments, the semiconductor device structure is formed using one or more single damascene processes. FIGS. 3A-3F are cross-sectional views of various stages of a process for forming a semiconductor device structure, in accordance with some embodiments. In some embodiments, the method 400 can also be applied in the embodiments illustrated in FIGS. 3A-3F.

Figure 3A:
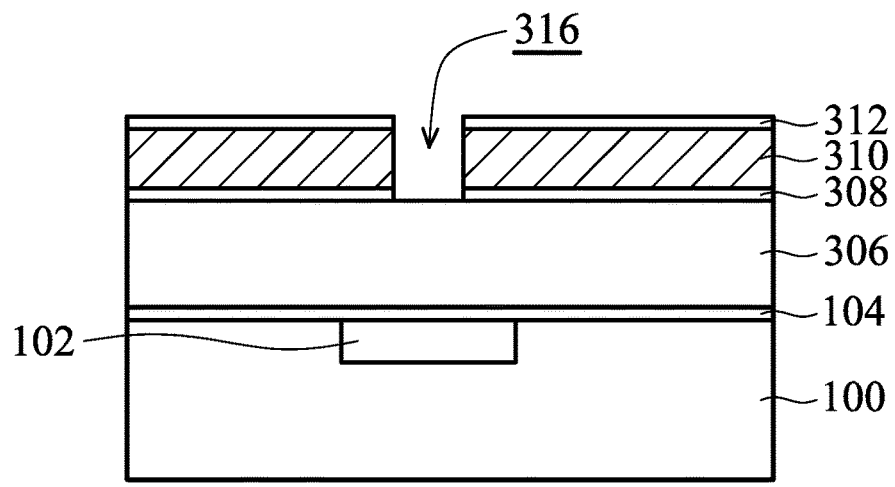
FIGS. 3A-3F are schematic cross-sectional views of various stages of a process for forming a semiconductor device structure, in accordance with some embodiments.

As shown in FIG. 3A, a structure similar to that shown in FIG. 1A is provided. The materials and/or formation methods of the semiconductor substrate 100, the conductive feature 102, and the etch stop layer 104 have been described and are not repeated. As shown in FIG. 3A, a dielectric layer 306 is deposited over the etch stop layer 104. In some embodiments, the material and formation method of the dielectric layer 306 are similar to those of the dielectric layer 106.

As shown in FIG. 3A, an anti-reflection layer 308, a hard mask layer 310, and a mask layer 312 are formed over the dielectric layer 306, in accordance with some embodiments. In some embodiments, the materials and formation methods of them are similar to those of the anti-reflection layer 108, the hard mask layer 110, and the mask layer 112.

Similar to the embodiments illustrated in FIGS. 1B and 1C, the mask layer 312 is patterned to assist in the patterning of the hard mask layer 310. As shown in FIG. 3A, an opening 316 is formed in the hard mask layer 310. In some embodiments, the opening 316 extends into the anti-reflection layer 308. In some embodiments, the opening 316 exposes the dielectric layer 306. In some embodiments, the opening 316 is formed using a method similar to that is used for forming the opening 116. Therefore, the opening 316 also has a substantially vertical sidewall.

Figure 3B:
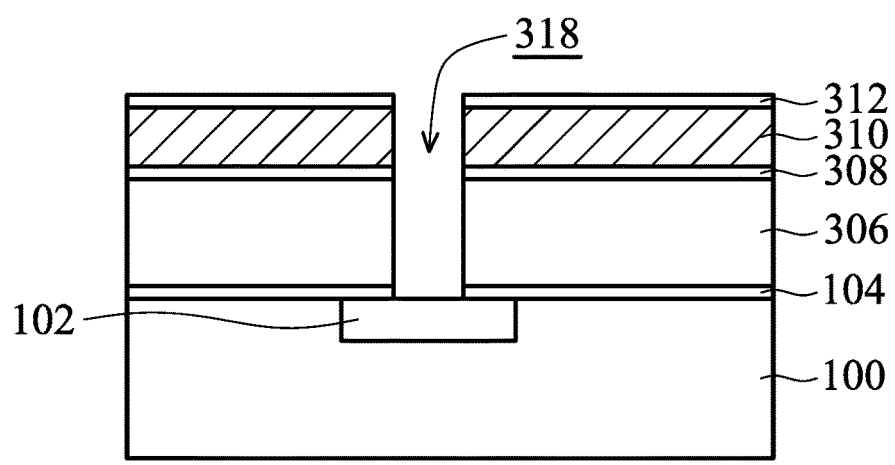

As shown in FIG. 3B, the dielectric layer 306 is etched through the opening 316 in the hard mask layer 310 to form a feature opening 318, in accordance with some embodiments. In some embodiments, the etch stop layer 104 is etched using another etching operation such that the feature opening 318 exposes the conductive feature 102. Similar to the feature opening 118, the feature opening 318 also has a substantially vertical sidewall. In some embodiments, the feature opening 318 serves as a contact hole. In these cases, the conductive feature 102 may be a source/drain region or a gate electrode. In some other embodiments, the feature opening 318 serves as a via hole. In these cases, the conductive feature 102 may be a conductive line or conductive pad.

Figure 3C:
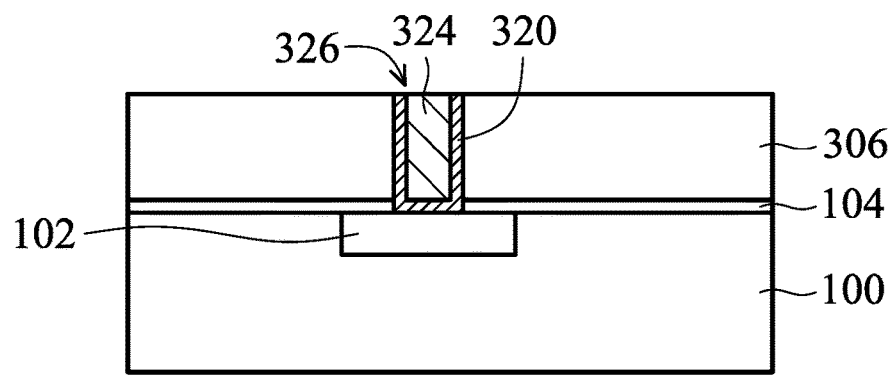

Afterwards, a barrier layer 320 and a conductive material 324 are formed in the feature opening 318. In some embodiments, the materials and formation methods of the barrier layer 320 and the conductive material 324 are similar to those of the barrier layer 122 and the conductive material 124. Similarly, a planarization process is performed to remove the barrier layer 320 and the conductive material 324 outside of the feature opening 318 and the anti-reflection layer 308, the hard mask layer 310, and the mask layer 312 above the dielectric layer 306. As a result, a conductive feature 326 is formed, as shown in FIG. 3C in accordance with some embodiments. In these cases, the conductive feature 326 is formed using a single damascene process. In some embodiments, the conductive feature 326 serves as a conductive contact. In some other embodiments, the conductive feature 326 serves as a conductive via.

Figure 3D:
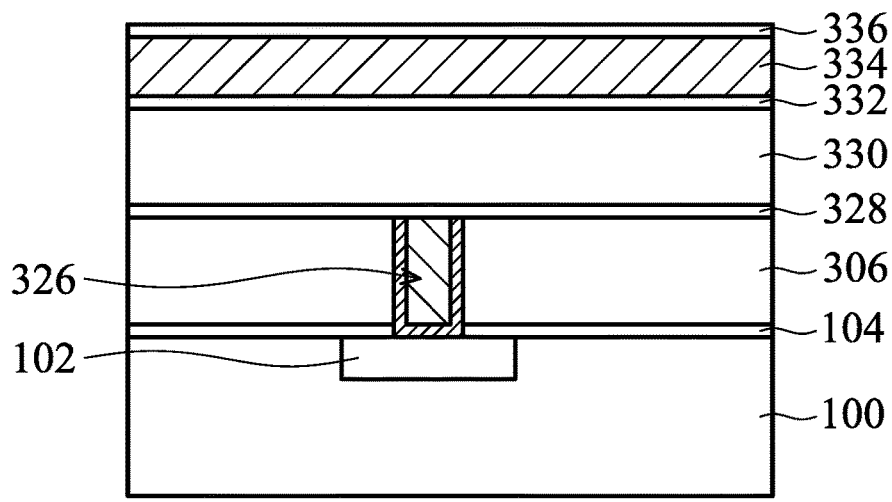

As shown in FIG. 3D, an etch stop layer 328 is deposited over the conductive feature 326 and the dielectric layer 306, in accordance with some embodiments. In some embodiments, the material and formation method of the etch stop layer 328 are similar to those of the etch stop layer 104. Afterwards, a dielectric layer 330 is deposited over the etch stop layer 328, as shown in FIG. 3D. In some embodiments, the material and formation method of the dielectric layer 330 are similar to those of the dielectric layer 106.

Afterwards, an anti-reflection layer 332, a hard mask layer 334, and a mask layer 336 are deposited over the dielectric layer 330, as shown in FIG. 3D in accordance with some embodiments. In some embodiments, the materials and formation methods of them are similar to those of the anti-reflection layer 108, a hard mask layer 110, and a mask layer 112.

Figure 3E:
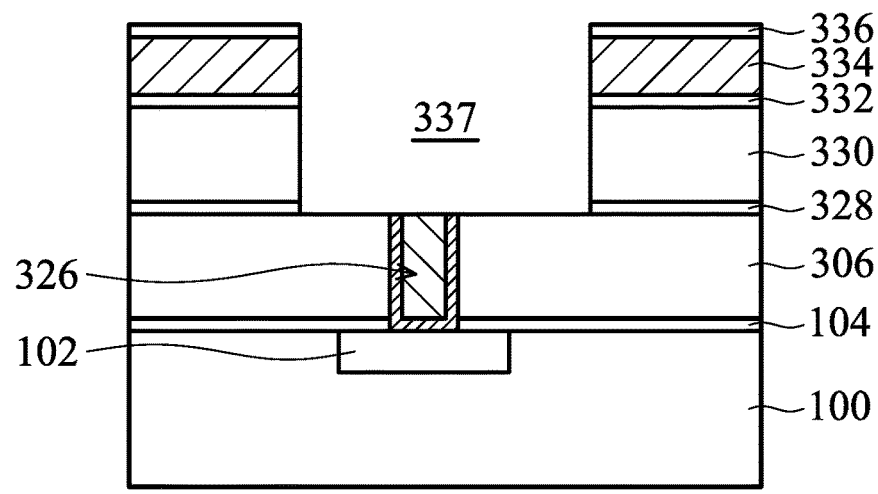

As shown in FIG. 3E, a feature opening 337 is formed to expose the conductive feature 326, in accordance with some embodiments. In some embodiments, the feature opening 337 serves as a trench opening. The formation method of the feature opening is similar to that of the feature opening 318. The etching condition for patterning the hard mask layer 334 is carefully controlled to ensure that the hard mask layer 334 has a substantially vertical sidewall. Afterwards, the dielectric layer 330 is etched with the hard mask layer 334 as an etching mask. As a result, the feature opening 337 also has a substantially vertical sidewall.

Figure 3F:
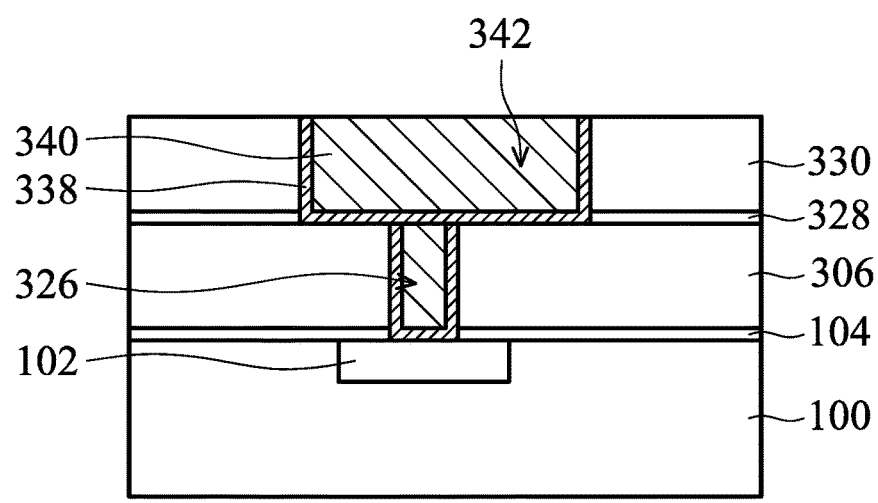

Afterwards, a barrier layer 338 and a conductive material 340 are formed in the feature opening 337, as shown in FIG. 3F in accordance with some embodiments. In some embodiments, the materials and formation methods of the barrier layer 338 and the conductive material 340 are similar to those of the barrier layer 122 and the conductive material 124. Similarly, a planarization process is performed to remove the barrier layer 338 and the conductive material 340 outside of the feature opening 337 and the anti-reflection layer 332, the hard mask layer 334, and the mask layer 336 above the dielectric layer 330. As a result, a conductive feature 342 is formed, as shown in FIG. 3F in accordance with some embodiments. In these cases, the conductive feature 342 is formed using a single damascene process. In some embodiments, the conductive feature 342 serves as a conductive line.

Embodiments of the disclosure use a hard mask layer as an etching mask to assist in the formation of a feature opening in a dielectric layer. A gas mixture is used in a plasma etching process for forming an opening in the hard mask layer. The composition of the gas mixture is carefully maintained to ensure that the opening formed in the hard mask layer has a vertical sidewall. Afterwards, the dielectric layer is etched through the opening with the vertical sidewall to form the feature opening in the dielectric layer. With the assistance of the hard mask layer having the vertical sidewall, the feature opening also has a vertical sidewall accordingly. Afterwards, the feature opening is filled with one or more conductive materials to form a conductive feature. Due to the well-controlled profile of the feature opening, the quality and reliability of the conductive feature are improved.

In accordance with some embodiments, a method for forming a semiconductor device structure is provided. The method includes forming a dielectric layer over a semiconductor substrate and forming a hard mask layer over the dielectric layer. The method also includes performing a plasma etching process to etch the hard mask layer to form an opening, and a gas mixture used in the plasma etching process includes a nitrogen-containing gas, a halogen-containing gas, and a carbon-containing gas. The gas mixture has a volumetric concentration of the nitrogen-containing gas in a range from about 20% to about 30%. A volumetric concentration ratio of the carbon-containing gas to the halogen-containing gas in the gas mixture is equal to about 0.3. The method further includes etching the dielectric layer through the opening in the hard mask layer to form a feature opening in the dielectric layer. In addition, the method includes forming a conductive material in the feature opening.

In accordance with some embodiments, a method for forming a semiconductor device structure is provided. The method includes forming a dielectric layer over a semiconductor substrate and forming a hard mask layer over the dielectric layer. The method also includes forming a mask layer over the hard mask layer and patterning the mask layer by using a photoresist layer. The method further includes removing the photoresist layer and performing a plasma etching process to etch the hard mask layer to form an opening after the photoresist layer is removed. A gas mixture used in the plasma etching process includes a nitrogen-containing gas, a halogen-containing gas, and a carbon-containing gas. The gas mixture has a volumetric concentration of the nitrogen-containing gas in a range from about 20% to about 30%, and a volumetric concentration ratio of the carbon-containing gas to the halogen-containing gas in the gas mixture is equal to about 0.3. The patterned mask layer is used as an etching mask while the hard mask layer is etched to form the opening. In addition, the method includes etching the dielectric layer through the opening in the hard mask layer to form a feature opening in the dielectric layer and forming a conductive material in the feature opening.

In accordance with some embodiments, a method for forming a semiconductor device structure is provided. The method includes forming a dielectric layer over a semiconductor substrate and forming a hard mask layer over the dielectric layer. The method also includes forming a mask layer over the hard mask layer and patterning the mask layer by using a photoresist layer. The method further includes removing the photoresist layer and performing a plasma etching process to etch the hard mask layer to form an opening with a vertical sidewall after the photoresist layer is removed. A gas mixture used in the plasma etching process includes a nitrogen-containing gas, a halogen-containing gas, and a carbon-containing gas, and the gas mixture has a volumetric concentration of the nitrogen-containing gas in a range from about 20% to about 30%. A volumetric concentration ratio of the carbon-containing gas to the halogen-containing gas in the gas mixture is equal to about 0.3. The patterned mask layer is used as an etching mask while the hard mask layer is etched to form the opening. In addition, the method includes etching the dielectric layer through the opening in the hard mask layer to form a feature opening in the dielectric layer and forming a conductive material in the feature opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a material layer over a semiconductor substrate;
    forming a hard mask layer over the material layer, wherein the hard mask layer contains metal;
    forming an opening in the hard mask layer using a plasma etching process, wherein a gas mixture used in the plasma etching process includes a nitrogen-containing gas, a halogen-containing gas, and a carbon-containing gas, wherein a volumetric concentration ratio of the carbon-containing gas to the halogen-containing gas in the gas mixture is equal to about 0.3; and
    etching the material layer through the opening in the hard mask layer to form a feature opening in the material layer.

2. The method for forming a semiconductor device structure as claimed in claim 1, wherein the gas mixture has a volumetric concentration of the nitrogen-containing gas in a range from about 20% to about 30%.

3. The method for forming a semiconductor device structure as claimed in claim 1, wherein the hard mask layer is made of titanium nitride.

4. The method for forming a semiconductor device structure as claimed in claim 1, wherein the halogen-containing gas comprises chlorine gas, the nitrogen-containing gas comprises nitrogen gas, and the carbon-containing gas comprises methane gas.

5. The method for forming a semiconductor device structure as claimed in claim 1, further comprising partially removing the material layer to form a hole extending from a bottom portion of the feature opening.

6. The method for forming a semiconductor device structure as claimed in claim 1, further comprising forming a hole in the material layer before the feature opening is formed and after the opening is formed in the hard mask layer.

7. The method for forming a semiconductor device structure as claimed in claim 1, further comprising removing the hard mask layer.

8. The method for forming a semiconductor device structure as claimed in claim 1, wherein an angle between a sidewall and a bottom portion of the opening is in a range from about 89 degrees to about 91 degrees.

9. The method for forming a semiconductor device structure as claimed in claim 1, wherein the gas mixture has a volumetric concentration of the nitrogen-containing gas in a range from about 22% to about 28%.

10. A method for forming a semiconductor device structure, comprising:
    forming a material layer over a semiconductor substrate;
    forming a hard mask layer over the material layer, wherein the hard mask layer is a metal-containing layer;
    forming an opening in the hard mask layer using a plasma etching process, wherein a gas mixture used in the plasma etching process includes a nitrogen-containing gas, a halogen-containing gas, and a carbon-containing gas, and a volumetric concentration of the halogen-containing gas is greater than a volumetric concentration of the carbon-containing gas and wherein the gas mixture has a volumetric concentration of the nitrogen-containing gas in a range from about 20% to about 30%; and
    etching the material layer through the opening in the hard mask layer to form a feature opening in the material layer.

11. The method for forming a semiconductor device structure as claimed in claim 10, wherein the hard mask layer comprises titanium nitride.

12. The method for forming a semiconductor device structure as claimed in claim 10, wherein the nitrogen-containing gas is nitrogen gas, the halogen-containing gas is chlorine gas, and the carbon-containing gas is methane gas.

13. The method for forming a semiconductor device structure as claimed in claim 10, wherein a volumetric concentration ratio of the carbon-containing gas to the halogen-containing gas in the gas mixture is equal to about 0.3.

14. A method for forming a semiconductor device structure, comprising:
    forming a material layer over a semiconductor substrate;
    forming a hard mask layer over the material layer, wherein the hard mask layer contains metal;
    performing a plasma etching process to etch the hard mask layer to form an opening with a vertical sidewall, wherein a gas mixture used in the plasma etching process includes a nitrogen-containing gas, a halogen-containing gas, and a carbon-containing gas, and the gas mixture has a volumetric concentration of the nitrogen-containing gas in a range from about 20% to about 30%; and
    etching the material layer through the opening in the hard mask layer to form a feature opening in the material layer.

15. The method for forming a semiconductor device structure as claimed in claim 14, wherein the hard mask layer is made of titanium nitride.

16. The method for forming a semiconductor device structure as claimed in claim 14, wherein the nitrogen-containing gas is nitrogen gas, the halogen-containing gas is chlorine gas, and the carbon-containing gas is methane gas.

17. The method for forming a semiconductor device structure as claimed in claim 14, wherein a volumetric concentration ratio of the carbon-containing gas to the halogen-containing gas in the gas mixture is equal to about 0.3.

18. The method for forming a semiconductor device structure as claimed in claim 14, further comprising forming an anti-reflection layer over the material layer before the hard mask layer is formed.

19. A method for forming a semiconductor device structure, comprising:
   forming a material layer over a semiconductor substrate;
   forming a hard mask layer over the material layer, wherein the hard mask layer contains metal;
   forming an opening in the hard mask layer using a plasma etching process, wherein a gas mixture used in the plasma etching process includes a nitrogen-containing gas, a halogen-containing gas, and a carbon-containing gas, and forming a protection material along sidewalls of the opening during the plasma etching process; and
   etching the material layer through the opening in the hard mask layer to form a feature opening in the material layer.

* * * * *